United States Patent
Kawasaki

(10) Patent No.: US 8,809,830 B2
(45) Date of Patent: Aug. 19, 2014

(54) VARIABLE RESISTANCE MEMORY

(75) Inventor: Hirohisa Kawasaki, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 140 days.

(21) Appl. No.: 13/425,668

(22) Filed: Mar. 21, 2012

(65) Prior Publication Data

US 2013/0075686 A1   Mar. 28, 2013

(30) Foreign Application Priority Data

Sep. 22, 2011 (JP) ................................. 2011-207445

(51) Int. Cl.
*H01L 45/00* (2006.01)

(52) U.S. Cl.
USPC ...................................... 257/4; 257/E45.001

(58) Field of Classification Search
CPC .. H01L 45/1233; H01L 45/085; H01L 27/101
USPC ................... 365/143, 163; 257/2–5
See application file for complete search history.

(56) References Cited

U.S. PATENT DOCUMENTS

| | | | | |
|---|---|---|---|---|
| 2007/0008773 A1* | 1/2007 | Scheuerlein | ................. | 365/161 |
| 2009/0014707 A1 | 1/2009 | Lu et al. | | |
| 2010/0085798 A1 | 4/2010 | Lu et al. | | |
| 2010/0102290 A1 | 4/2010 | Lu et al. | | |
| 2011/0169126 A1* | 7/2011 | Chen et al. | ..................... | 257/528 |
| 2011/0305064 A1* | 12/2011 | Jo et al. | ......................... | 365/148 |
| 2011/0305065 A1* | 12/2011 | Nazarian et al. | .............. | 365/148 |

OTHER PUBLICATIONS

Sung Hyun Jo and Wei Lu. "CMOS Compatible Nanoscale Nonvolatile Resistance Switching Memory." Nano Letters vol. 8, No. 2, pp. 392-397, 2008.

Japanese Office Action issued on Jan. 28, 2014 in corresponding Japanese Application No. 2011-207445, with English translation, 6 pages.

* cited by examiner

*Primary Examiner* — David Vu
*Assistant Examiner* — Jonathan Han
(74) *Attorney, Agent, or Firm* — Oblon, Spivak, McClelland, Maier & Neustadt, L.L.P.

(57) ABSTRACT

A variable resistance memory according to the present embodiment includes a memory cell including an ion source electrode including metal atoms, an opposite electrode, an amorphous silicon film formed between the ion source electrode and the opposite electrode, and a polysilicon film formed between the amorphous silicon film and the ion source electrode.

17 Claims, 5 Drawing Sheets

A-A CROSS-SECTION

VARIABLE RESISTANCE MEMORY

CROSS-REFERENCE TO RELATED APPLICATION

This application is based upon and claims the benefit of priority from prior Japanese Patent Application No. 2011-207445 filed on Sep. 22, 2011 in Japan, the entire contents of which are incorporated herein by reference.

FIELD

Embodiments described herein relate generally to variable resistance memories.

BACKGROUND

Variable resistance memories have been known as nonvolatile semiconductor memory devices. A variable resistance memory is a memory in which two-terminal variable resistance elements each having a variable resistance layer interposed between two electrodes are used as memory elements. In such a variable resistance memory, information writing and reading are performed by utilizing reversible changes in the variable resistance layer between a high-resistance state and a low-resistance state in accordance with the history of voltage application between the electrodes. Even if the voltage between the two electrodes is cut off, the resistance state of the variable resistance layer is maintained. Therefore, such a variable resistance memory is a type of nonvolatile memory.

Variable resistance elements are classified into several types on the basis of the types of variable resistance layers and electrodes. For example, there are redox variable resistance elements that utilize movement of oxygen defects in transition metal oxides, ion-conducting variable resistance elements that utilize movement of metal ions or the like in the variable resistance layers, and the like.

DETAILED DESCRIPTION

A variable resistance memory of this embodiment includes a memory cell that includes: an ion source electrode including metal atoms; an opposite electrode; an amorphous silicon film formed between the ion source electrode and the opposite electrode; and a polysilicon film formed between the amorphous silicon film and the ion source electrode.

First, before embodiments are described, the course of events for achieving the embodiments will be described below.

Cross-point type variable resistance memories (hereinafter also referred to as ion memories) each having ion-conducting variable resistance elements as memory elements are being considered for the next-generation file memories. However, it is difficult for those ion memories to satisfy the following three requirements at the same time:

1) Low-current operations can be performed.
2) Current flows when a bias is applied, but current does not flow when a reverse bias is applied (unidirectional rectification).
3) Excellent data retention characteristics can be achieved.

To satisfy the requirement 1), it is critical to control the resistivity of a conduction path (a filament) formed between the two electrodes sandwiching the variable resistance layer. This filament is formed with movable ions. To maintain a high-resistance state for low-current operations, the filament needs to be thin. However, if the filament is thin, the ions forming the filament are detached from the filament due to thermal disturbance, and the possibility that the conduction path will become discontinuous is high. This means that, while a voltage is not being applied to the memory cell, a transition from an ON state (a low-resistance state) to an OFF state (a high-resistance state) easily occurs. In other words, a thin filament results in poor data retention characteristics. If a thick conduction path is formed to improve the data retention characteristics, the current for performing writing in the variable resistance element increases from a value on the order of μA to a value on the order of mA, resulting in an increase in operating voltage. Therefore, the power consumption also becomes larger. Furthermore, a thick filament is not easily broken down even if a reverse bias is applied. As a result, no unidirectional rectification is performed in the memory element.

The following is a description of embodiments, with reference to the accompanying drawings.

First Embodiment

Figure 1:
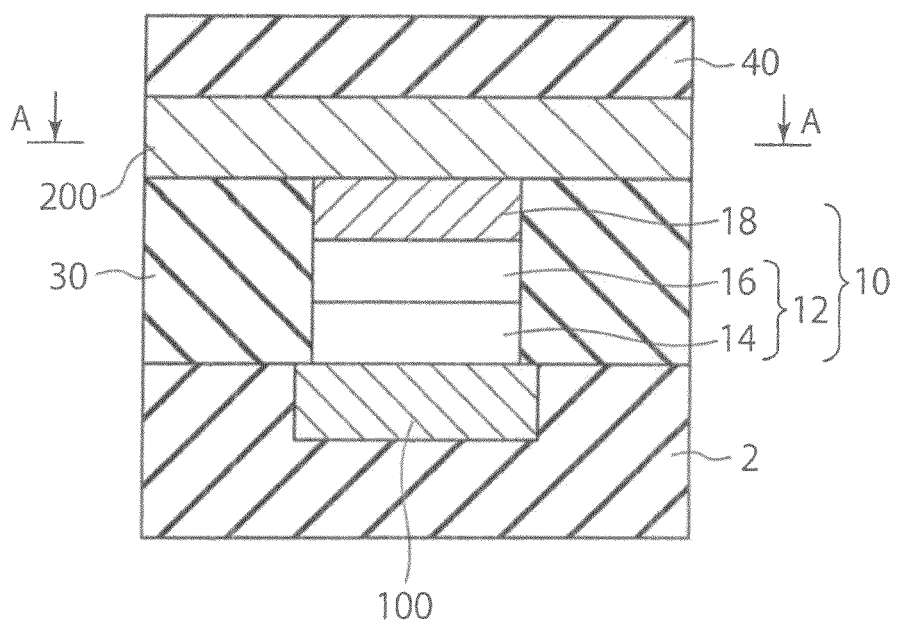
FIG. 1 is a cross-sectional view of a variable resistance memory according to a first embodiment.
Figure 2:
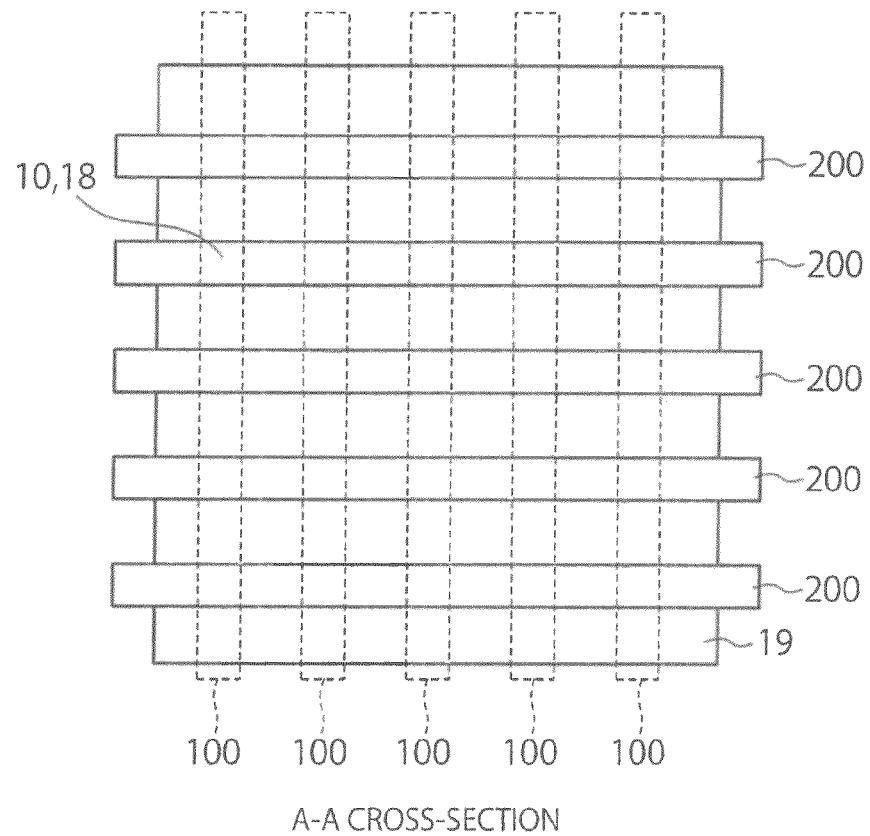
FIG. 2 is a cross-sectional view of the variable resistance memory of the first embodiment, taken along the section line A-A defined in FIG. 1.

Referring to FIGS. 1 and 2, a variable resistance memory according to a first embodiment is described. FIG. 1 is a cross-sectional view of the variable resistance memory of the first embodiment. FIG. 2 is a cross-sectional view of the variable resistance memory, taken along the section plane A-A defined in FIG. 1.

The variable resistance memory of the first embodiment is a cross-point type variable resistance memory. In this variable resistance memory, memory cells (variable resistance elements) 10 are provided between first wirings 100 and second wirings 200 intersecting with the first wirings 100. The first wirings 100 are arranged so that the upper faces thereof are exposed through an insulating film 2.

Figure 7:
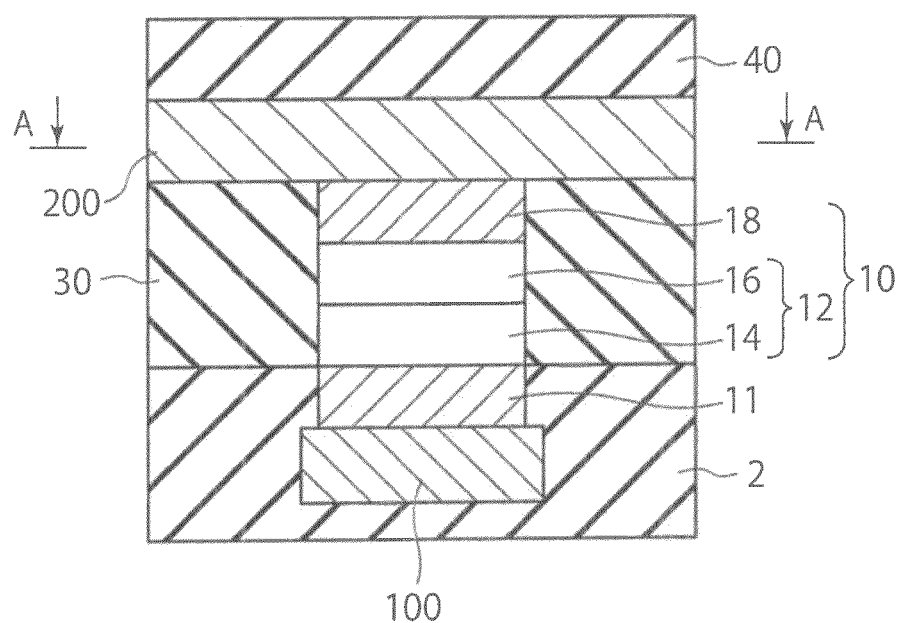
FIG. 7 is a cross-sectional view of a variable resistance memory according to a modification of the first embodiment.

The memory cells 10 are provided in the intersection regions between the first wirings 100 and the second wirings 200. Each of the memory cells 10 includes a variable resistance film 12 formed on the corresponding first wiring 100, and an ion source electrode 18 that is made of Ag and is formed on the variable resistance film 12. In this case, the first wiring 100 serves as the opposite electrode. Alternatively, the opposite electrode 11 can be provided between the first wiring 100 and the variable resistance film 12 as shown in FIG. 7. The ion source electrode can include at least one of Ag, Co, Ni, Cu, Ti, Al, Au, Cr, Mn, Fe, Zn, Sn, In, Pd, Pb, and Bi. The opposite electrode 11 can be made of a polysilicon doped with n-type or p-type impurities. A barrier metal (not shown) can also be provided between the first wiring 100 (the opposite electrode) and the variable resistance film 12. The variable resistance film 12 includes an amorphous silicon film 14 doped with an N-type impurity, for example, and a polysilicon film 16 formed on the amorphous silicon film 14. An example of the impurity introduced into the amorphous silicon film 14 is nitrogen. The nitrogen is introduced through a $N_2O$ gas, for example. The amorphous silicon film 14 is designed to have a smaller film thickness than the film thickness of the polysilicon film 16. The amorphous silicon film 14 can contain silicon microcrystals.

An interlayer insulating film 30 made of $SiO_2$, for example, is provided on each side of the memory cells 10. Also, an interlayer insulating film 40 is provided to cover the second wirings 200. The second wirings 200 can be buried in an interlayer insulating film (not shown), and the interlayer insulating film 40 can be then formed to cover the second wirings 200. The memory cell is surrounded with a silicon oxide film.

Figure 3:
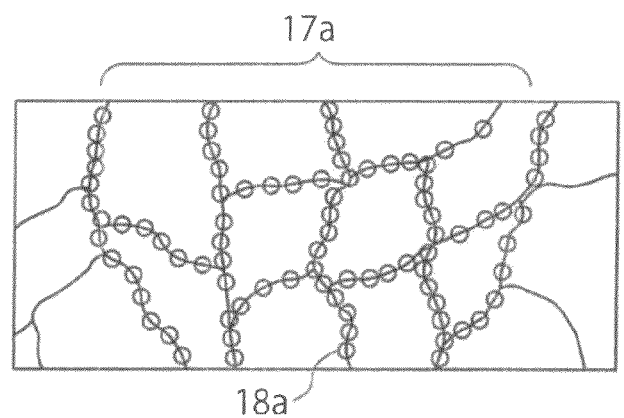
FIG. 3 is a diagram for explaining a filament main portion formed in a polysilicon film.
Figure 4:
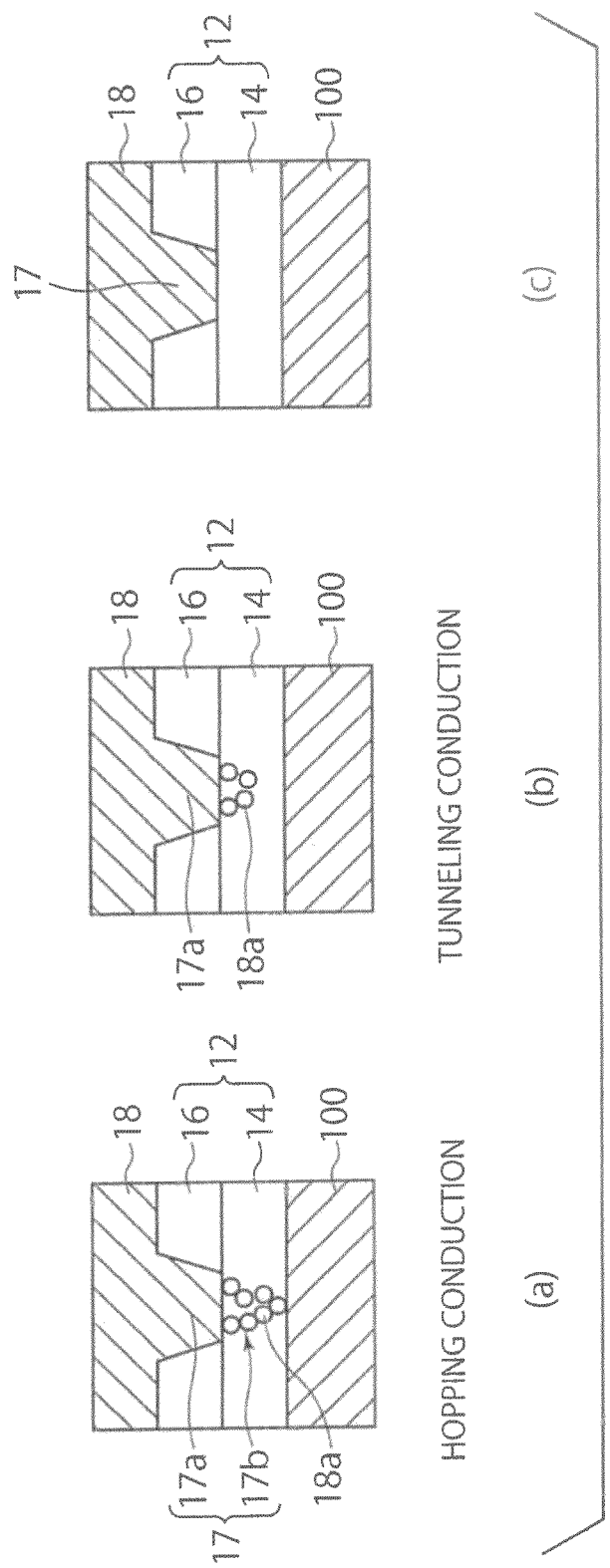
FIGS. 4(a), 4(b), and 4(c) are diagrams for explaining operations of the variable resistance memory of the first embodiment.

Referring now to FIGS. 3 through 4(c), operations of the variable resistance memory of the first embodiment are described. First, in the variable resistance memory having the above described structure, voltages are applied between each first wiring 100 and each corresponding second wiring 200, to perform forming. The forming is performed by applying a higher potential (a forming voltage) to the second wiring 200 than to the first wiring 100. By performing the forming, metal ions (Ag ions, for example) are released from the ion source electrode 18 toward the polysilicon film 16, and the Ag ions 18a move along the grain boundaries in the polysilicon film 16 as shown in FIG. 3. As a result, a filament main portion 17a is formed by the Ag ions 18a (FIG. 4(a)). The Ag ions 18a also diffuse into the amorphous silicon film 14, and are trapped by crystal defects in the amorphous silicon film 14. After the filament main portion 17a is formed by the forming, the variable resistance film 12 is switched between a high-resistance state and a low-resistance state, depending on voltages applied between the first wiring 100 and the second wiring 200. The resistivity of the variable resistance film 12 in the high-resistance state is higher than the electric resistivity observed prior to the formation of the filament main portion 17a.

For example, after the forming, a higher potential is applied to the second wiring 200 than to the first wiring 100, though lower than the forming voltage. As a result, the Ag ions 18a that diffuse into the amorphous silicon film 14 and are trapped by crystal defects form a filament top end portion 17b, as shown in FIG. 4(a). That is, a filament 17 is formed with the main portion 17a and the top end portion 17b. The filament top end portion 17b has a reversed pyramid shape. That is, there is a distribution such that the number of Ag ions 18a becomes smaller from the filament main portion 17a toward the first wiring 100. This distribution can be a distribution involving at least one Ag ion. Electrons from the first wiring 100 reach the filament main portion 17a by performing hopping conduction through the Ag ions 18a forming the filament top end portion 17b. The electrons that have reached the main portion 17a of the filament 17 flow into the ion source electrode 18 and the second wiring 200 via the main portion 17a. As a result of this, the variable resistance film 12 is put into the low-resistance state (a set state). In this manner, the hopping conduction portion 17b is formed with the Ag ions 18a in the amorphous silicon film 14, and the metallic conduction portion 17a is formed with the Ag ions 18a in the polysilicon film 16.

If the potential to be applied to the second wiring 200 is lowered and is made a positive potential with respect to the first wiring 100 in the situation illustrated in FIG. 4(a), the Ag ions 18a forming the top end portion 17b of the reversed pyramid shape diffuse into the amorphous silicon film 14. However, many of the diffused Ag ions 18a exist in the vicinity of the main portion 17a, as shown in FIG. 4(b). Therefore, the electrons from the first wiring 100 tunnel through the amorphous silicon film 14, and reach the main portion 17a. The electrons that have reached the main portion 17a of the filament 17 flow into the ion source electrode 18 and the second wiring 200 via the main portion 17a. That is, in the situation illustrated in FIG. 4(b), a tunneling current flows. At this point, the variable resistance film 12 has a resistance that is higher than that in the low-resistance state and is equal to or lower than that in the later described high-resistance state. The situation where the tunneling current is flowing as shown in FIG. 4(b) is also called a weak-reset state.

If the potential of the second wiring 200 is made equal to or lower than the potential of the first wiring 100 in the situation illustrated in FIG. 4(b), many of the Ag ions 18a existing in the vicinity of the main portion 17a of the filament 17 move away from the main portion 17a, and spread all over the amorphous silicon film 14. That is, the Ag ions 18a are dispersed, and the variable resistance film 12 is put into the high-resistance state (a reset state).

In any of the situations illustrated in FIGS. 4(a) through 4(c), the Ag atoms (Ag ions) in the variable resistance film 12 have a distribution such that the concentration of the Ag atoms is high in regions near the ion source electrode 18, is low in regions near the first wiring 100, and is medium in regions in between. That is, the Ag atoms have a distribution such that the concentration of the Ag atoms becomes lower from the ion source electrode 18 toward the first wiring 100 (the opposite electrode).

In the variable resistance memory of the first embodiment having the above structure, the current flowing in the variable resistance film 12 can be restricted by the thinnest region of the filament 17, and accordingly, a low-current operation can be performed.

In the first embodiment, the metal ions (atoms) existing at the top end portion 17b of the filament 17 are detached from the main portion 17a of the filament 17 by an applied reverse bias, and the top end portion 17b of the filament 17 is not formed (FIG. 4(c)). That is, when the potential to be applied to the second wiring 200 is made positive with respect to the first wiring 100, the top end portion 17b is formed in the amorphous silicon film 14, and a current flows. When the potential to be applied to the second wiring 200 is made equal to or negative with respect to the potential of the first wiring 100, the top end portion 17b is not formed, and unidirectional rectification becomes relatively easy. Here, being "relatively easy" means being easier than to move the metal ions (atoms) in the filament main portion 17a and make the filament discontinuous.

Also, in the first embodiment, the top end portion 17b of the filament 17 is located near the opposite electrode 100, and the amorphous silicon film 14 is made to have a smaller film thickness than the film thickness of the polysilicon film 16. Accordingly, the length of the top end portion 17b can be made smaller than the length of the main portion 17a. Thus, data retention characteristics can be dramatically improved, compared with the data retention characteristics achieved in a case where the variable resistance film 12 has a single-layer film, and a thin filament is formed in the entire variable resistance film 12.

Also, in the first embodiment, the length of the top end portion 17b is smaller than the length of the main portion 17a. Therefore, even if the top end portion 17b of the filament 17 is not formed in a stand-by state, metal ions (atoms) relatively quickly re-adhere to the main portion 17a by virtue of the electric field applied to the amorphous silicon film 14 at the time of reading, and the top end portion 17b is again formed, to make the conduction path continuous. Accordingly, the period of time required for regenerating the filament 17 can be certainly shortened, compared with the period of time required in a case where the variable resistance film 12 is a single-layer film.

Further, the set voltage (the voltage for the switch from the high-resistance state to the low-resistance state) depends on the film thickness of the amorphous silicon film 14. Therefore, the variation of the film thickness of the amorphous silicon film 14 becomes smaller in this embodiment where the film thickness of the amorphous silicon film 14 is smaller than that of the polysilicon film 16. Accordingly, the variation of the set voltage becomes smaller.

In this embodiment, the stacking order of the films forming each memory cell 10 can be reversed. That is, the ion source electrode 18 can be formed on the first wiring 100, the polysilicon film 16 may be formed on the ion source electrode 18, the amorphous silicon film 14 can be formed on the polysilicon film 16, and the second wiring 200 can be formed on the amorphous silicon film 14. In this case, the second wiring 200 serves as the opposite electrode. Alternatively, the opposite electrode can be provided between the second wiring 200 and the amorphous silicon film 14.

Also, third wirings intersecting with the second wirings 200 can be provided above the second wirings 200, and memory cells each formed in the reverse stacking order of the stacking order of the memory cells 10 of this embodiment can be provided in the intersection regions between the second wirings 200 and the third wirings.

As described above, the first embodiment can provide a variable resistance memory that is capable of performing low-current operations, and has unidirectional rectification and excellent data retention characteristics.

Second Embodiment

Figure 5:
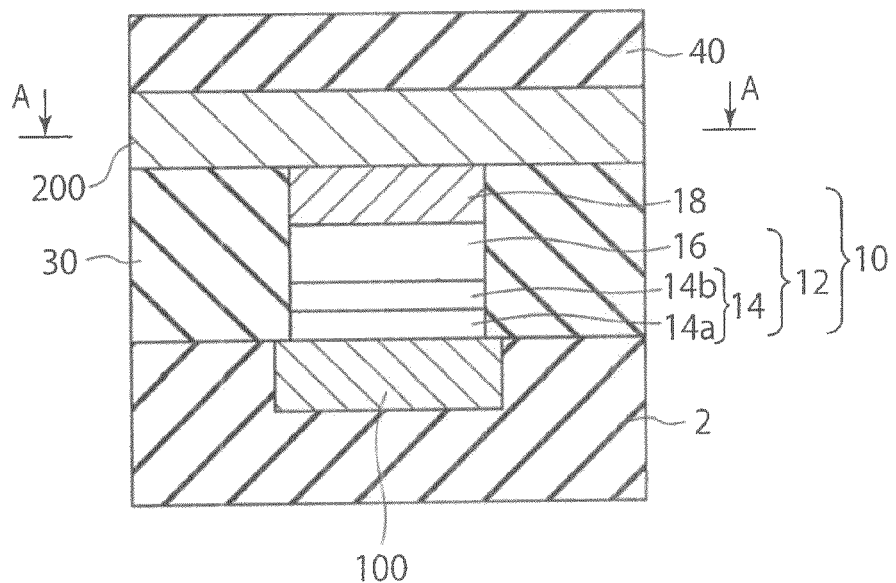
FIG. 5 is a cross-sectional view of a variable resistance memory according to a second embodiment.

FIG. 5 is a cross-sectional view of a variable resistance memory according to a second embodiment. The variable resistance memory of the second embodiment is the same as the variable resistance memory of the first embodiment illustrated in FIG. 1, except that the amorphous silicon film 14 has a two-layer structure consisting of amorphous silicon layers 14a and 14b doped with an N-type impurity, for example. The amorphous silicon layers 14a and 14b can contain microcrystal silicon. The amorphous silicon layer 14a is formed on the first wiring 100, and the amorphous silicon layer 14b is formed on the amorphous silicon layer 14a. The grain size in the amorphous silicon layer 14a is larger than the grain size in the amorphous silicon layer 14b.

In the variable resistance memory of the second embodiment having the above described structure, the amorphous silicon layer 14b having the smaller grain size can restrain the metal ions existing in the polysilicon film 16 from diffusing into the amorphous silicon layer 14a. In other words, the amorphous silicon layer 14b having the smaller grain size plays the role of a filter, to prevent easy diffusion of metal ions from the polysilicon film 16 into the amorphous silicon layer 14a having the larger grain size. Accordingly, a thick filament is not easily formed in the amorphous silicon layer 14a having the larger grain size.

In the second embodiment, the Ag atoms (Ag ions) in the variable resistance film 12 also have a distribution such that the concentration of the Ag atoms is high in regions near the ion source electrode 18, is low in regions near the first wiring 100, and is medium in regions in between. That is, the Ag atoms have a distribution such that the concentration of the Ag atoms becomes lower from the ion source electrode 18 toward the first wiring 100.

Like the first embodiment, the second embodiment can also provide a variable resistance memory that is capable of performing low-current operations, and has unidirectional rectification and excellent data retention characteristics.

Third Embodiment

Figure 6:
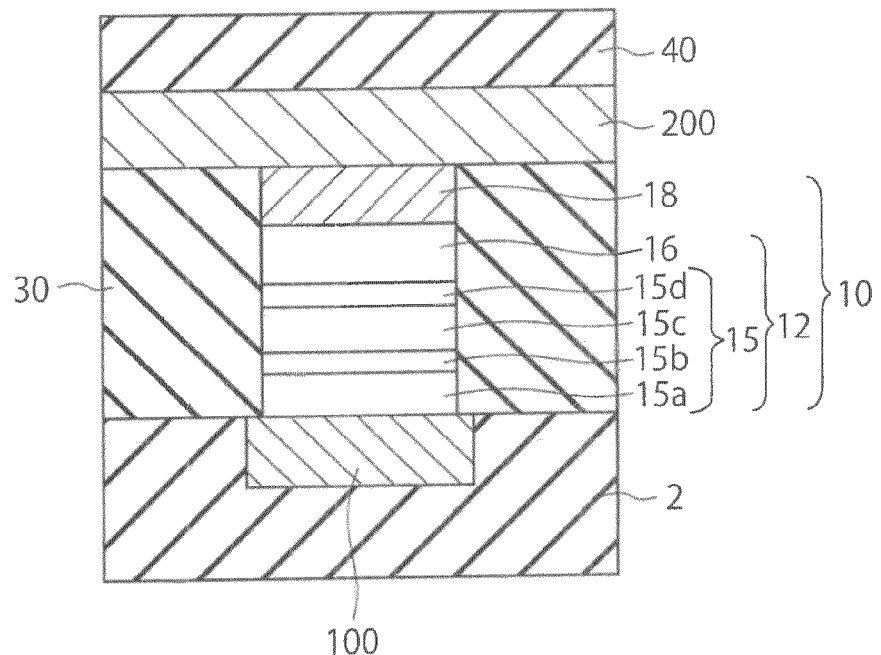
FIG. 6 is a cross-sectional view of a variable resistance memory according to a third embodiment.

FIG. 6 is a cross-sectional view of a variable resistance memory according to a third embodiment. The variable resistance memory of the third embodiment is the same as the variable resistance memory of the first embodiment illustrated in FIG. 1, except that the amorphous silicon film 14 is replaced with a film stack 15 having a stack structure including amorphous silicon layers and silicon microcrystal layers. The film stack 15 has a structure formed by stacking an amorphous silicon layer 15a doped with an N-type impurity, for example, a silicon microcrystal layer 15b, an amorphous silicon layer 15c doped with an N-type impurity, for example, and a silicon microcrystal layer 15d, in this order. Each silicon microcrystal layer contains silicon microcrystals, and the silicon microcrystals are silicon having grains of 1 to 2.5 nm in grain size. The amorphous silicon layers 15a and 15c can contain silicon microcrystals.

The silicon microcrystal layers 15b and 15d restrain Ag diffusion. The grain size in the amorphous silicon layer 15a is smaller than the grain size in the polysilicon film 16, and is larger than the grain size in the amorphous silicon layer 15c. The grain size in the amorphous silicon layer 15c is larger than the grain sizes in the silicon microcrystal layers 15b and 15d. The density of crystal defects in the amorphous silicon layer 15a is higher than the density of crystal defects in the amorphous silicon layer 15c. Accordingly, the Ag ions forming the conduction path are easily detached, and the hopping barrier is low. Therefore, the filament formed in the amorphous silicon layer 15a tends to be discontinuous. However, the film thickness of the amorphous silicon layer 15a is small enough, and current flows by virtue of a tunneling phenomena.

With the set voltage, the Ag ions are trapped by crystal defects in the amorphous silicon layer 15c, and a discontinuous conduction path is formed. Accordingly, a hopping conduction portion is formed in the amorphous silicon layer 15c.

The film stack 15 can be formed by adjusting the amount of the impurity, such as $N_2O$, to be introduced into the amorphous silicon layers 15a and 15c. For example, in the film stack 15, the flow rate of $N_2O$ is made lower when an amorphous silicon layer is formed, and the flow rate of $N_2O$ is made higher when a silicon microcrystal layer is formed.

In the third embodiment, the Ag atoms (Ag ions) in the variable resistance film 12 also have a distribution such that the concentration of the Ag atoms is high in regions near the ion source electrode 18, is low in regions near the first wiring 100, and is medium in regions in between. That is, the Ag atoms have a distribution such that the concentration of the Ag atoms becomes lower from the ion source electrode 18 toward the first wiring 100.

Like the first embodiment, the third embodiment can also provide a variable resistance memory that is capable of performing low-current operations, and has unidirectional rectification and excellent data retention characteristics.

While certain embodiments have been described, these embodiments have been presented by way of example only, and are not intended to limit the scope of the inventions.

Indeed, the novel methods and systems described herein can be embodied in a variety of other forms; furthermore, various omissions, substitutions and changes in the form of the methods and systems described herein can be made without departing from the spirit of the inventions. The accompanying claims and their equivalents are intended to cover such forms or modifications as would fall within the scope and spirit of the inventions.

What is claimed is:

1. A variable resistance memory comprising
a memory cell including:
an ion source electrode including metal atoms;
an opposite electrode; and
a variable resistance film formed between the ion source electrode and the opposite electrode, and comprising an amorphous silicon film and a polysilicon film, the polysilicon film being formed between the amorphous silicon film and the ion source electrode.

2. The variable resistance memory according to claim 1, wherein the amorphous silicon film includes microcrystal silicon.

3. The variable resistance memory according to claim 1, wherein a metal atom concentration in the polysilicon film is higher than a metal atom concentration in the amorphous silicon film.

4. The variable resistance memory according to claim 1, wherein the amorphous silicon film has a smaller film thickness than a film thickness of the polysilicon film.

5. The variable resistance memory according to claim 1, wherein the ion source electrode includes at least one of Ag, Co, Ni, Cu, Ti, Al, Au, Cr, Mn, Fe, Zn, Sn, In, Pd, Pb, and Bi.

6. The variable resistance memory according to claim 1, wherein the ion source electrode includes Ag.

7. The variable resistance memory according to claim 1, wherein a concentration of the metal atoms in the amorphous silicon film and the polysilicon film decrease from the ion source electrode toward the opposite electrode.

8. The variable resistance memory according to claim 1, further comprising:
a first wiring connected to the ion source electrode; and
a second wiring connected to the opposite electrode, the second wiring intersecting with the first wiring,
wherein the memory cell is located in an intersection region between the first wiring and the second wiring.

9. The variable resistance memory according to claim 1, wherein a polysilicon doped with n-type or p-type impurities is used as the opposite electrode.

10. The variable resistance memory according to claim 9, wherein the memory cell is surrounded with a silicon oxide film.

11. The variable resistance memory according to claim 9, wherein the first and second wirings are formed with tungsten.

12. The variable resistance memory according to claim 1, wherein the amorphous silicon film includes a first amorphous silicon layer and a second amorphous silicon layer formed between the first amorphous silicon layer and the polysilicon film, a grain size in the second amorphous silicon layer being smaller than a grain size in the first amorphous silicon layer.

13. The variable resistance memory according to claim 12, wherein the first and second amorphous silicon layers contain microcrystal silicon.

14. The variable resistance memory according to claim 12, further comprising:
a first silicon microcrystal layer formed between the first amorphous silicon layer and the second amorphous silicon layer; and
a second silicon microcrystal layer formed between the second amorphous silicon layer and the polysilicon film.

15. The variable resistance memory according to claim 14, wherein a grain size in the first silicon microcrystal layer is smaller than a grain size in the polysilicon film.

16. The variable resistance memory according to claim 15, wherein the grain size in the second amorphous silicon layer is larger than a grain size in the first and second silicon microcrystal layer.

17. The variable resistance memory according to claim 12, wherein a crystal defect density in the first amorphous silicon layer is higher than a crystal defect density in the second amorphous silicon layer.

* * * * *